United States Patent [19]

Martino

[11] 4,148,576

[45] Apr. 10, 1979

[54] APPARATUS FOR CONTINUOUSLY PROCESSING FILM IN A HORIZONTAL THROUGH-PUT MANNER

[76] Inventor: Peter V. Martino, 9960 65th Rd., Rego Park, N.Y. 11374

[21] Appl. No.: 932,372

[22] Filed: Aug. 9, 1978

[51] Int. Cl.² ............................................. G03D 3/08
[52] U.S. Cl. .................................... 354/320; 354/325; 354/338; 118/419; 118/427; 15/77
[58] Field of Search ............... 354/312, 315, 316, 317, 354/318, 319, 320, 321, 322; 118/419, 427, 429; 134/64 P, 122 P; 15/77, 102, 100

[56] References Cited

U.S. PATENT DOCUMENTS

| | | | |
|---|---|---|---|
| 3,589,261 | 6/1971 | Krikelis | 354/320 |
| 3,593,641 | 7/1971 | Adams | 354/317 |
| 3,608,464 | 9/1971 | Harrell | 354/317 |
| 3,682,079 | 8/1972 | Casson | 354/319 |
| 3,694,071 | 9/1972 | Touchette | 354/319 |
| 3,732,808 | 5/1973 | Graham | 354/319 |
| 3,916,426 | 10/1975 | Bown | 354/319 |
| 4,119,991 | 10/1978 | Martino | 354/320 |

Primary Examiner—L. T. Hix
Assistant Examiner—Alan Mathews
Attorney, Agent, or Firm—Anthony J. Casella

[57] ABSTRACT

An apparatus for continuously processing, in a horizontal through-put manner, a thin substrate having an image carrying coating on one surface thereof includes tank member for containing the processing solution, the tank having an entry end and an exit end. A pair of rotatable entry rollers is disposed adjacent the entry end of the tank, the entry rollers being disposed one above the other in nip contact for receiving the substrate and conveying it downstream in the apparatus. Guidance members disposed adjacent the entry rollers are included to receive the substrate from the entry rollers and direct it into the processing solution. A pair of rotatable holding rollers is disposed adjacent the entry rollers in the solution, the holding rollers being disposed one above the other in nip contact for receiving the substrate and conveying it in a horizontal direction within the processing solution. A scrubbing device for scrubbing the coated side of the substrate is disposed adjacent the nip of the holding rollers. The scrubbing device includes a rotatable brush roller, and a support roller disposed above the brush roller and in nip contact therewith. The support roller includes a shaft portion and a plurality of substantially cylindrical, individually rotatable, free-wheeling anvil members, disposed around the shaft in closely spaced, substantially frictionless relationship. A second guidance member disposed adjacent the scrubbing device is included for directing the substrate out of the processing solution. A pair of rotatable squeegee rollers is disposed adjacent the exit end of the tank, the squeegee rollers being disposed one above the other in nip contact for receiving the substrate, removing excess solution therefrom, and conveying the substrate towards the exit end of the tank. The subject apparatus further includes a motor for rotating the entry rollers, holding rollers and squeegee rollers at substantially the same speed, and a separate motor for rotating the brush roller at a speed greater than the entry rollers, holding rollers, and squeegee rollers.

11 Claims, 6 Drawing Figures

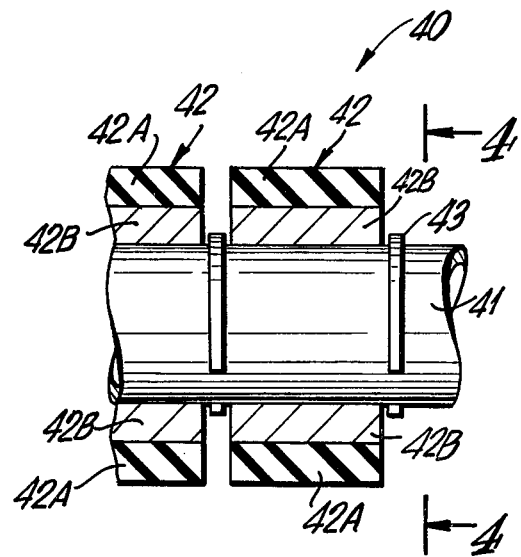
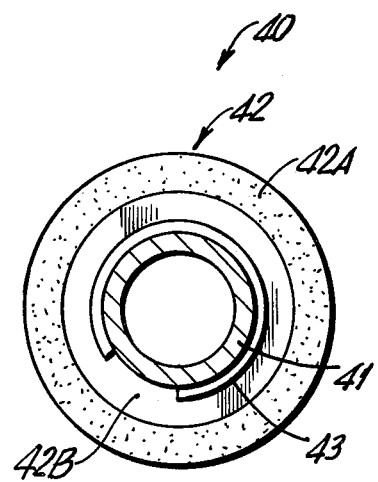
FIG.3  FIG.4
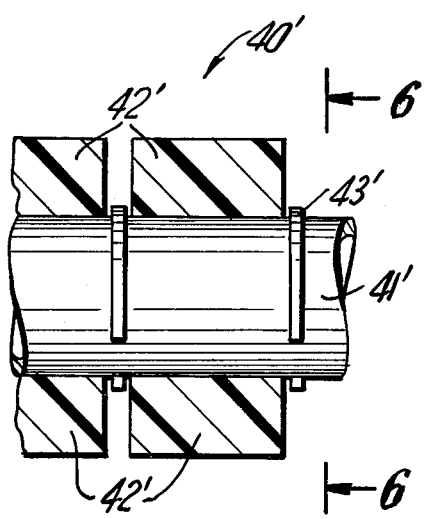
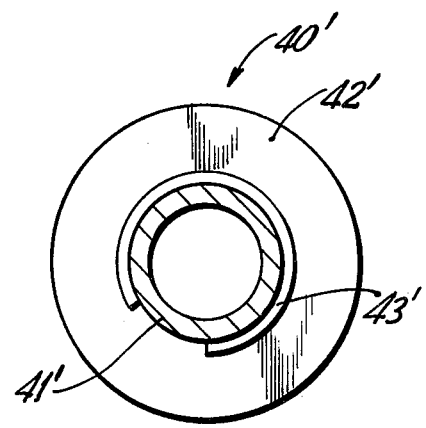
FIG.5  FIG.6

APPARATUS FOR CONTINUOUSLY PROCESSING FILM IN A HORIZONTAL THROUGH-PUT MANNER

BACKGROUND OF THE INVENTION

The subject invention relates to an apparatus for processing film, and more particularly, to an apparatus for developing film, color proofing film, photographic film, very light gauge of aluminum foil or other flexible back materials having a coating containing an image exposed on one side of the film. In a typical process, the film, which may be a plastic type material such as Mylar, has an emulsion coating on one surface thereof. The coating is exposed so that an image is formed on the coating. The image bearing film is then treated with a developer which washes away unwanted areas of coating leaving the desired image on the surface of the film. Typical machines for effecting the development of the film include means for applying developer solution to the coated film; means for scrubbing the film such that unwanted areas of coating are removed from the film; and means for removing excess solution from the film. The apparatus may also typically include means for further rinsing the film after it has been once dried and then second means for removing excess rinsing solution. The films of the above described type are typically used in color proofing systems to develop a set up for basic color negatives, namely, red, yellow, blue and black. The four films are then superimposed over one another to enable a printer to determine whether or not he has the correct color intensities to make up his full color photographs. It will be appreciated that the film must be very thin, typically on the order of 2 to 4 mil. thickness, such that an accurate image is created when the films are superimposed one above the other.

Because the film is so thin, there has been difficulty in handling them with known processors. Specifically, known processors, which generally include a plurality of drive rolls and brush rolls in nip contact for acting on and conveying the film, have a tendency to buckle and scratch the film thus rendering many sheets of film unfit for use. In addition, there is often slippage of the film in the nips of the various rollers thus making it quite difficult to process a plurality of films, one after the other, in continuous manner.

Accordingly, it is an object of the subject invention to provide an apparatus that can process very thin sheets of film in a continuous through-put manner in which the risks of damage to the film due to buckling and scrathching are substantially eliminated.

SUMMARY OF THE INVENTION

In accordance with the above recited objectives, the apparatus of the subject invention for continuously processing thin sheets of film having an image carrying coating on one face thereof includes a tank member for containing the processing solution, the tank having an entry and a delivery end. A pair of rotatable entry rollers is disposed adjacent the entry end of the tank, the rollers being disposed one above the other above the processing solution, with the top roller leading the bottom roller to form a downwardly directed nip for receiving the film and driving it towards the processing solution. Preferably, the subject apparatus also includes means for guiding the thin sheet of film to a predetermined position within the solution, namely to the nip of a pair of holding rollers which are disposed in the solution for receiving the film and transporting it in a horizontal direction. Means for scrubbing the film while it is in the processing solution is disposed adjacent the nip of the holding rollers. In accordance with the subject invention, this scrubbing means includes first and second roller members which are disposed one above the other in the solution. The bottom roller member is a rotatable brush roller for scrubbing the image carrying surface of the film so as to remove unwanted areas of coating. The top roller member is a free-wheeling anvil or support member for holding the sheet of film against the brush roller so that the brush can effectively scrub the film. In one embodiment of the subject invention, the support roller member comprises a shaft member having a plurality of spaced apart roller portions each of which is individually free-wheeling and rotatable around the shaft. The shaft may be made from a metal such as steel, while the roller portions may be made from a substantially frictionless substance such as teflon. In accordance with the subject invention, it is preferable that the spacing between the individual roller members be maintained such that the rotationablility of the rollers around the shaft will be substantially frictionless. It will be understood that while the roller portions should be substantiallyfrictionless with respect to the shaft, they must have enough frictional contact with the film so as to overcome the frictional contact of the brush roller. The shaft may also be of hollow configuration such as to house therein, if desired, weights for reinforcing the scrubbing action of the brush roller disposed thereunder. In another embodiment of the subject invention, the individually rotatable roller members may be made from an elastomeric material each having a metal liner on the interior surface thereof, the liner being connected to shaft. Typcially, both the shaft and the metal liner are steel so as to assure a minimum of friction between the shaft and the individual roller member. Preferably, the brush roller disposed underneath the support roller leads the support roller such that the nip formed therebetween is upwardly directed thus leading the film out of the solution. In addition, the nip between the brush roller and support roller is disposed within the processing solution such that the scrubbing action takes place within the solution.

The subject apparatus further includes means for maintaining the film substantially in a flat orientation as it exits the developer solution, the film flattening means being disposed adjacent the nip of the scrubbing rollers. Typically, the film flattening means may comprise a pair of substantially parallel, upwardly directed plate members which are closely spaced apart. The subject apparatus further includes a first pair of suqeegee rollers disposed one above the other in nip contact adjacent the film flattening means for receiving the film and conveying it downstream in the apparatus. Preferably, the lower squeegee roller leads the top squeegee roller so as to form an upwardly directed nip for conveying the film upwardly in the apparatus.

In the preferred embodiment of the subject invention, spray means is disposed adjacent the first set of squeegee rollers for spraying a rinsing solution onto the surface of the film. A second set of squeegee rollers is disposed between the spray means and the exit end of the apparatus for receiving the film, drying it of excess rinsing solution and directing it in a horizontal direction towards the exit end of the apparatus for future use.

BRIEF DESCRIPTION OF THE DRAWINGS

FIG. 3 is a partial cross-sectional view of the support roller member of the subject invention.

FIG. 4 is a cross-sectional view of the support roller member of the subject invention taken along lines 4—4 of FIG. 3.

FIG. 5 is a partial cross-sectional view of an embodiment of the support roller member of the subject invention.

FIG. 6 is a cross-sectional view of the alternate embodiment of the support roller member of the subject invention taken along lines 6—6 of FIG. 5.

DETAILED DESCRIPTION OF THE PREFERRED EMBODIMENTS

Figure 1:
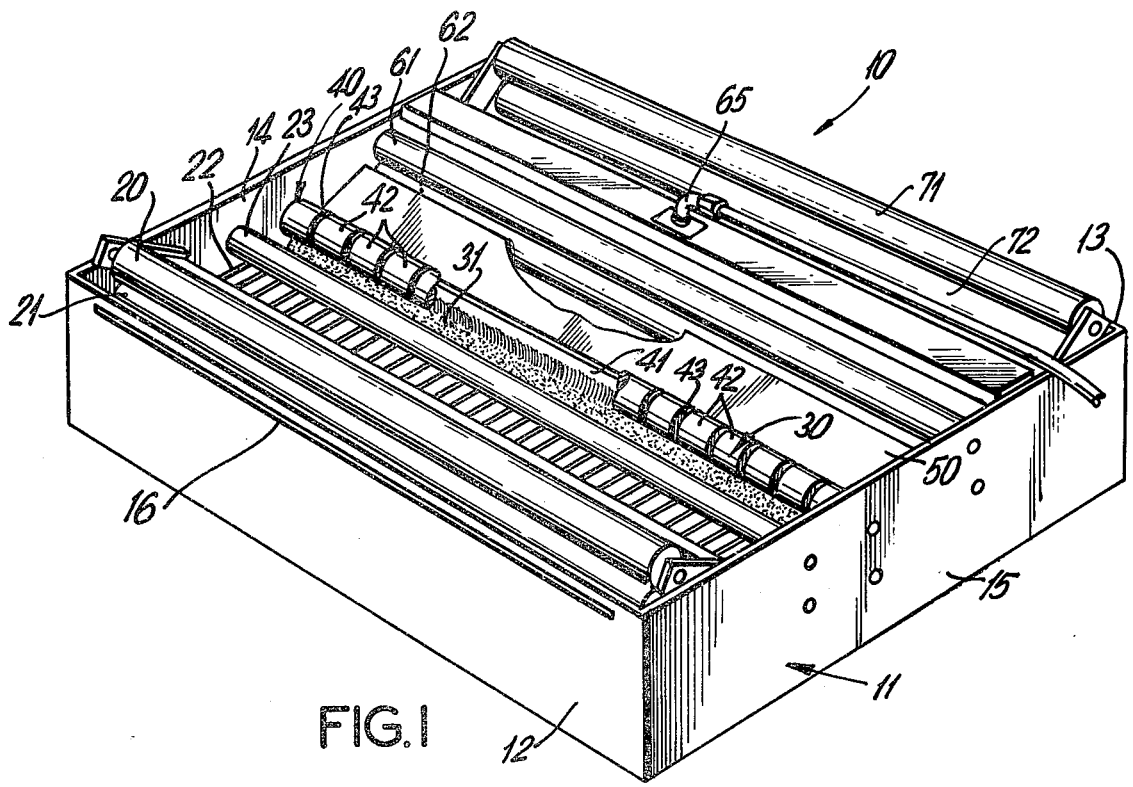
FIG. 1 is a perspective view, broken away in part, of the apparatus of the subject invention.
Figure 2:
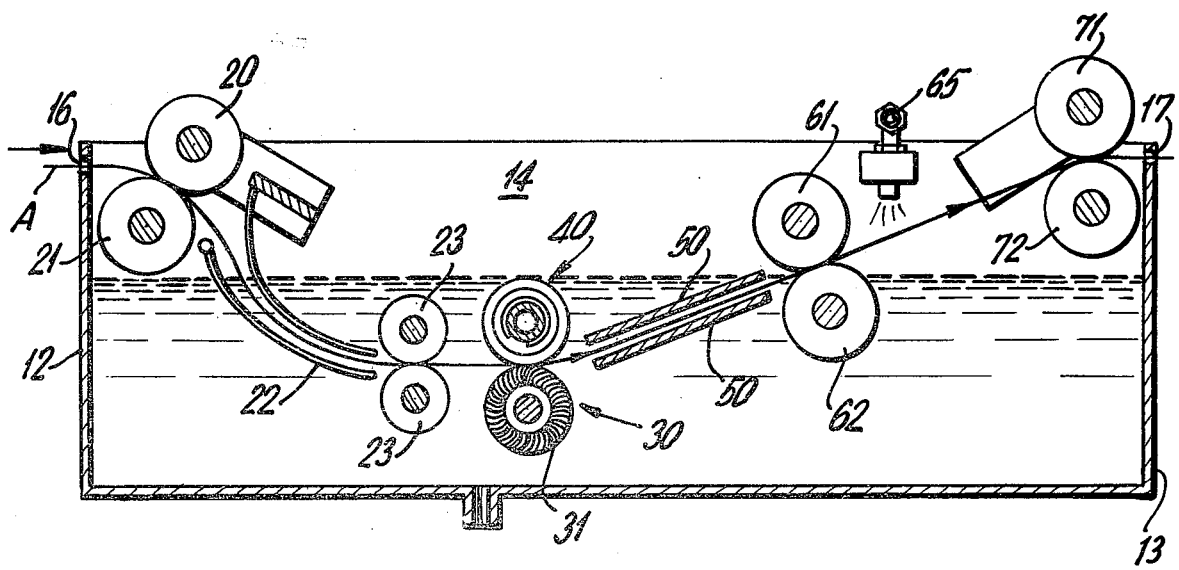
FIG. 2 is a schematic cross-sectional view of the apparatus of the subject invention.

Referring to FIGS. 1 and 2, the subject apparatus, which is designated generally by reference numeral 10, includes an outer casing 11, having an entrance end 12, an exit end 13, and a pair of opposed side walls 14 and 15. An entry slot 16 is provided near the entrance end of the casing for admitting a sheet of film or foil to the apparatus. A delivery slot 17 is disposed at the exit end of the apparatus for ejecting the processed sheet for future use. A pair of entry rollers 20 and 21 are disposed one above the other in nip contact and adjacent to entry slot 16 for receiving the sheet of film and conveying it downstream in the apparatus. Preferably, the upper entry roller 20 leads the lower entry roller 21 so as to form a downwardly directing nip for leading the film into the processing solution. The subject apparatus further includes a guidance means 22 for directing the film to a predetermined point in the processing solution. As illustrated in FIGS. 1 and 2, guidance means 22 may typically be a pair of spaced apart wire grid members, one end of each being disposed adjacent the nip of entry rollers 20 and 21, the other end of each being submerged in the processing solution. Grid members 22 may be curved so as to first lead the film downwardly into the solution and then horizontally within the solution. Preferably, the wire grid members are coated with a substance such as teflon so as to render them substantially frictionless, thus minimizing the risk of scratching the film to be processed. A pair of holding rollers 23 is disposed one above the other in nip contact within the solution and adjacent the downstream portion of guidance means 22. As illustrated most clearly in FIG. 2, it is preferable that the nip of holding rollers 23 be directly adjacent the downstream end of guidance means 22. This insures that the very thin leading edge of the film will be properly captured by the nip of the holding rollers 23 for conveying the film in a horizontal direction within the processing solution.

Further referring to FIG. 2, the subject apparatus includes a means for scrubbing the film so as to remove the unwanted image carrying coating, the scrubbing means being designated generally by reference numeral 30. As illustrated in the figures, scrubbing means 30 comprises a lower brush roller member 31 and an upper support roller member 40 disposed above and in nip contact with brush roller 31. Preferably, the nip between brush roller 31 and support roller 40 is disposed within the processing solution, with the bottom brush roller 31 leading the top support roller 40 such that the nip is upwardly directed for leading the film out of the processing solution. It will be noted that because of the specific orientation of brush roller 31 and support roller 40, it is the bottom surface of the film that is scrubbed by brush roller 31. Accordingly, it will be understood that the film must be fed into the apparatus with the image carrying surface facedown.

Referring now specifically to FIG. 1, 3 and 4, the support roller 40 of the subject invention comprises a shaft member 41 which is preferably hollow in configuration so as to be able to house weights for effecting reinforced scrubbing action on the film. Support roller 40 further includes a plurality of closely spaced apart, substantially cylindrical, individually rotatable, free-wheeling roller or anvil members 42 which are disposed around shaft member 41. As illustrated in FIGS. 3 and 4, anvil members 42 comprise an outer shell member 42A which may by typically formed from an elastomeric material, and an inner liner portion 42B which may be formed from a metal such as stainless steel. The means for maintaining the separation between anvil members 42 may typically be C-rings 43 which are clamped onto shaft 41. In accordance with the subject invention, anvil members 42 must be lightweight and freely rotatable around shaft 41. Referring to FIGS. 5 and 6, an alternate embodiment of the support roller 40 of the subject invention is illustrated. More particularly, alternate support roller 40' comprises a shaft member 41', preferably of hollow configuration, and a plurality of spaced apart anvil members 42' which are individually rotatably mounted in close spaced apart relationship on the shaft member 41'. Anvil members 42' may typically be formed from a lightweight plastic material such as teflon or polyvinyl chloride such that the anvil members are substantially frictionless and free-wheeling along shaft member 41'. C-rings 43', fixedly mounted on shaft 41', maintain anvil members 42' in closely spaced, substantially frictionless free-wheeling relationship.

Referring again to FIGS. 1 and 2, the subject apparatus further includes film stiffening or guiding means 50 which is disposed adjacent the downstream nip of scrubbing means 30. As illustrated most clearly in FIG. 2, guidance means 50 may comprise a pair of flat, substantially parallel, closely spaced plate members which are upwardly inclined so as to direct the film out of the processing solution. It will be understood that other means, such as for example, a pair of grid members, may also be used. In the preferred embodiment of the subject invention, the apparatus 10 includes a first set of squeegee rollers 61 and 62 which are disposed one above the other in nip contact for removing excess solution from the film and conveying it downstream in the apparatus. Preferably, the nip of first squeegee rollers 61 and 62 is immediately adjacent the downstream end of guidance means 50 so as to insure that the leading edge of the plate will be properly received in the nip of squeegee rollers 61 and 62 as it leaves guidance means 50. It is also preferable that bottom squeegee roller 61 lead top squeegee roller 62 so as to form an upwardly directed nip for directing the film further upwardly and out of the processing solution.

Further referring to FIG. 2, the preferred embodiment of the subject apparatus further includes spray means 65 disposed downstream of the first set of squeegee rollers 61 and 62 for spraying a rinsing solution onto the film. A second set of squeegee rollers 71 and 72 is disposed downstream of spray means 65 and adjacent the exit end 13 of the apparatus for removing excess solution from the film and conveying the film towards the exit end of the apparatus. Preferably, the nip between second squeegee rollers 71 and 72 is aligned with exit slot 17 such that the fully processed film may easily and automatically exit therefrom for future use. It will be noted that while the first set of squeegee rollers 61 and 62, and spray means 65, have been described as a part of the preferred embodiment of the subject invention, said elements comprise a rinsing stage which may be eliminated from the subject apparatus and be included as part of a separate apparatus if needed.

In accordance with the subject invention, entry rollers 20 and 21, holding rollers 23, first squeegee rollers 61 and 62 and second squeegee rollers 71 and 72 are all rotated in the direction of travel of the film at substantially the same speed. Brush roller 31 is individually rotated so that it rotates at a speed much greater than that of the previously mentioned rollers, typically on the order of 20 to 25 times faster. As indicated above, anvil members 42 of support roller 40 are simply freewheeling.

In operation, a sheet of film or foil A to be processed is fed through entry slot 16 either manually, or by automatic conveying means. As indicated above, the image carrying surface of the film is fed to the subject apparatus face-down. Entry rollers 20 and 21 receive the leading edge of the film between their nip and convey the film downwardly towards the processing solution. Guidance means 22 receives the film after it leaves the nip of entry rollers 20 and 21 and guides it down into the processing solution and precisely to the nip of holding rollers 23. Holding rollers 23 serve to convey the film in a horizontal direction within the processing solution. They also serve another function which will be described below.

As illustrated in FIG. 2, it is preferable that the nip of holding rollers 23 be substantially aligned with the nip of support roller 40 and brush roller 31 such that the leading edge of the film may be properly captured by scrubbing means 30 as it leaves holding rollers 23. It will be noted, as indicated above, that the speed of rotation of brush roller 31 is much greater than that of entry rollers 20 and 21, holding rollers 23 and squeegee rollers 61, 62, 71 and 72, said latter rollers, of course, rotating at the speed of travel of the plate. It will also be noted that before a sheet of film is received between the nip of support roller 40 and brush roller 31, all of the freewheeling individual anvil members 42 are rotating at the same high speed as the brush roller because of their nip contact therewith. As soon as the leading edge of the film is received in the nip of support roller 40 and brush roller 31, the anvil members 42 are separated from brush roller 31 by the sheet of film, and in fact, slow down in speed to the precise rate of travel of the sheet of film in contact therewith. Thus, as the film is passing between the nip of support roller 40 and brush roller 31, the individual anvil members 42 are pressing against the sheet of film on one surface thereof, while the brush roller is rotating at a much greater rate on the other surface of the film so as to effect a scrubbing action thereon. It will be noted that because a portion of the film is still in the nip of holding rollers 23, there is no tendency of the film to travel at the higher rate of speed of the brush roller. In addition, because each anvil or roller member 42 is lightweight and has a low inertia, it immediately slows down to the speed of the film as soon as it comes in contact with the film, and out of contact with brush roller 31. The low inertia of anvil members 42 also prevents the film from increasing in speed to that of brush roller 31 when the trailing edge of the film leaves the nip of holding rollers 23. More particularly, the low inertia anvil members 42 continue to press against the film such that the film will proceed beyond brush roller 31 without being bent or buckled thereby. Further, because the anvil members 42 rotate at exactly the same speed as the film, there is no scratching, pushing, or buckling of the film. It will be noted that because of the specific construction of support roller 40, which includes individually rotatable anvil members 42, a sheet of film may be fed into the apparatus in any orientation. For example, if the sheet of film were fed into the apparatus with the corner thereof first, the individual anvil member 42 coming in contact with the corner would slow down to the speed of travel of the film while the remaining anvil members still in contact with the brush disposed therebelow would continue to travel at the high rate of speed of the brushes. Then, as more and more of the sheet came into the nip between support roller 40 and brush roller 31, more of the anvil members would slow down to the speed of the film. It will be understood that because of the specific construction of the subject support roller 40, with its individual anvil members 42, that the subject apparatus can also effectively process two small pieces of film being fed in the apparatus side by side.

In summary, the subject invention provides a new and improved apparatus for processing thin sheets of film or foil material. Because of the specific structure of the apparatus the film is processed with a minimum risk of damage caused by buckling, scratching, etc., even where the film has been fed to the apparatus in an improper orientation. In addition, because of its specific structure, the subject apparatus can process a plurality of sheets of film fed thereto side by side. Further because of its specific structure, the subject apparatus operates effectively and continuously with a minimum of stoppages.

While there have been described herein what are at present considered preferred embodiments of the invention, it will be obvious to those skilled in the art that many modifications and changes may be made therein without departing from the essence of the invention. It is therefore to be understood that the exemplary embodiments are illustrative and not restrictive of the invention, the scope of which is defined in the appended claims, and that all modifications that come within the meaning and range of equivalency of the claims are intended to be included therein.

What is claimed is:

1. An apparatus for continuously processing, in a horizontal through put manner, a thin substrate having an image carrying coating on one surface thereof comprising:

a tank for containing processing solution, said tank having an entry end and an exit end;

a pair of rotatable entry rollers disposed adjacent the entry end of said tank, said entry rollers being disposed one above the other in nip contact for receiving said substrate and conveying it downstream in said apparatus;

means for directing said substrate into the processing solution;

a pair of rotatable holding rollers disposed adjacent said entry rollers within the solution, said holding rollers being disposed one above the other in nip contact for receiving the substrate and conveying it in a horizontal direction within the processing solution;

means for scrubbing the coated side of the substrate disposed adjacent said holding rollers, said scrubbing means including a rotatable brush roller, and a support roller disposed above said brush roller and in nip contact therewith, said support roller including a shaft portion and a plurality of substantially cylindrical, individually rotatable, free-wheeling anvil members, disposed around said shaft member in closely spaced, substantially frictionless relationship;

means for directing said substrate out of the processing solution;

a pair of rotatable squeegee rollers disposed adjacent said exit end of said tank, said rotatable squeegee rollers being disposed one above the other in nip contact for receiving the substrate, removing excess solution therefrom, and conveying the substrate towards the exit end of the tank;

means for rotating said entry rollers, holding rollers and squeegee rollers at substantially the same speed; and means for rotating said brush roller at a speed greater than said entry rollers, holding rollers, and squeegee rollers.

2. An apparatus as recited in claim 1 in which said support roller shaft is hollow in configuration.

3. An apparatus as recited in claim 1 in which each of said support roller anvil members is formed from a lightweight plastic material.

4. An apparatus as recited in claim 1 in which each of said anvil members comprises an elastomeric outer shell portion and a metal inner liner portion.

5. An apparatus as recited in claim 1 in which said individually rotatable anvil members are maintained in closely spaced apart, substantially frictionless relationship by a plurality of C-rings each of which is fixedly mounted on said shaft between each of said anvil members.

6. An apparatus as recited in claim 1 in which said means for directing said substrate into the processing solution comprises a pair of closely spaced grid members, one end of which being adjacent the nip of said entry rollers, the other end of which being adjacent the nip of said holding rollers.

7. An apparatus as recited in claim 6 in which said grid members include a coating for minimizing friction between said grid members and said substrate.

8. An apparatus as recited in claim 1 in which said means for directing the substrate out of the processing solution comprises a pair of flat, substantially parallel, upwardly inclined plate members, one end of said plate members being disposed adjacent the nip between said support roller and said brush roller, the other end of said plate members being disposed out of the processing solution.

9. An apparatus as recited in claim 8 which further includes a second pair of squeegee rollers disposed one above the other in nip contact adjacent the downstream end of said upwardly inclined plate members for receiving said substrate, removing excess processing solution therefrom, and conveying said substrate downstream in the apparatus.

10. An apparatus as recited in claim 9 which further comprises spray means disposed adjacent the nip of said second set of squeegee rollers and adjacent the nip of said first set of squeegee rollers for spraying a rinsing solution onto said substrate after it emerges from the processing solution.

11. An apparatus for continuously processing in a horizontal through put manner a thin sheet of film having an image carrying coating on one face thereof comprising:

a tank member for containing the processing solution, said tank member having an entry end and an exit end;

a pair of rotatable entry rollers disposed adjacent said entry end of the tank, said entry rollers being disposed one above the other in nip contact with the bottom roller trailing the top roller so as to form a downwardly directed nip for receiving the film and conveying it in a downward direction towards the processing solution;

a film guidance means, one end of which being disposed adjacent the nip of said entry rollers, the other end thereof disposed within the processing solution for receiving the film from the entry rollers and directing it to a predetermined point within the processing solution;

a pair of rotatable holding rollers disposed adjacent the downstream end of said film guidance means, said holding rollers being disposed one above the other in nip contact for receiving the film and conveying it within the solution in a substantially horizontal direction;

means for scrubbing the coated surface of the film disposed adjacent the nip of said holding rollers, said scrubbing means including a rotatable brush roller and a support roller, disposed above and in nip contact with said brush roller, said support roller including a hollow metal shaft portion and a plurality of substantially cylindrical, individually rotatable, free-wheeling anvil members disposed around said shaft portion in substantially closely spaced, frictionless relationship, each of said anvil members being formed from a lightweight plastic material, said support roller further including a plurality of metal C-rings fixedly mounted onto said shaft, each of said C-rings being disposed between an anvil member for maintaining said anvil members in a closely spaced and frictionless relationship, said brush roller leading said support roller so as to form an upwardly directed nip for directing said film in an upwardly direction;

a pair of flat, substantially parallel, closely spaced, and upwardly inclined plate members, the lower ends of said plate members being disposed adjacent the nip between said support roller and said brush roller for receiving the film from said scrubbing means and directing it upwardly out of the processing solution;

a first pair of squeegee rollers disposed adjacent the downstream ends of said plate members, said squeegee rollers being disposed one above the other in nip contact, the bottom squeegee roller leading the top squeegee roller to form an upwardly directed nip disposed outside of the processing solution for receiving the film from said plate members, removing excess processing solution therefrom, and conveying the film upwardly and downstream in the apparatus;

spray means disposed adjacent said first pair of squeegee rollers for spraying a rinsing solution onto the film after said first set of squeegee rollers has removed the excess processing solution from the film;

a second set of squeegee rollers disposed downstream of said spray means and adjacent the exit end of said tank, said squeegee rollers being disposed one above the other in nip contact for receiving the film, removing excess rinsing solution therefrom, and conveying said film to the exit end of the tank;

means for rotating said entry rollers, holding rollers and squeegee rollers at substantially the same speed; and means for rotating said brush roller at a speed greater than said entry rollers, holding rollers, and squeegee rollers.

* * * * *